(12) United States Patent
Stettner et al.

(10) Patent No.: US 12,331,424 B2
(45) Date of Patent: Jun. 17, 2025

(54) METHOD FOR DEPOSITING AN EPITAXIAL LAYER ON A SUBSTRATE WAFER

(71) Applicant: SILTRONIC AG, Munich (DE)

(72) Inventors: Thomas Stettner, Waging am See (DE); Martin Wengbauer, Winhoering (DE)

(73) Assignee: SILTRONIC AG, Munich (DE)

( * ) Notice: Subject to any disclaimer, the term of this patent is extended or adjusted under 35 U.S.C. 154(b) by 223 days.

(21) Appl. No.: 18/040,991

(22) PCT Filed: Jul. 21, 2021

(86) PCT No.: PCT/EP2021/070393
§ 371 (c)(1),
(2) Date: Feb. 8, 2023

(87) PCT Pub. No.: WO2022/037889
PCT Pub. Date: Feb. 24, 2022

(65) Prior Publication Data
US 2023/0265581 A1    Aug. 24, 2023

(30) Foreign Application Priority Data
Aug. 17, 2020   (EP) ..................................... 20191322

(51) Int. Cl.
*C30B 25/16*    (2006.01)
*C30B 25/12*    (2006.01)
(Continued)

(52) U.S. Cl.
CPC .............. *C30B 25/16* (2013.01); *C30B 25/12* (2013.01); *C30B 25/18* (2013.01); *C30B 29/06* (2013.01)

(58) Field of Classification Search
CPC ......... C30B 25/16; C30B 25/12; C30B 25/18; C30B 29/06
See application file for complete search history.

(56) References Cited

U.S. PATENT DOCUMENTS

2007/0227441 A1   10/2007 Narahara et al.
2009/0214843 A1    8/2009 Lite et al.
(Continued)

FOREIGN PATENT DOCUMENTS

CN    104028773 A    9/2014
CN    109881183 A    6/2019
(Continued)

OTHER PUBLICATIONS

Ghim, Young-Sik et al., "Reflectometry-based wavelength scanning interferometry for thickness measurements of very thin wafers," vol. 18, Optics Express, p. 6522, XP055938792.
(Continued)

*Primary Examiner* — Robert M Kunemund
(74) *Attorney, Agent, or Firm* — Brooks Kushman P.C.

(57) ABSTRACT

An epitaxial layer is deposited on a substrate wafer by a method including measuring an edge geometry of the wafer, placing the wafer at a position in a pocket of a susceptor of a device for depositing the layer based on the edge geometry, heating the wafer, and passing a process gas over the wafer. Thickness characteristic values are assigned to edge portions based on the edge geometry. The position in the pocket is determined as function of an expected change in the thickness characteristic value to an eccentricity E, which is determined by prior testing of the device. The function is a result of the shape of the pocket which has a boundary having a circular circumference. The distance from the wafer to the boundary of the pocket is less at thicker edge portions and greater at thinner edge portion so the layer has thicknesses inverse to the wafer thicknesses.

20 Claims, 6 Drawing Sheets

(51) Int. Cl.
*C30B 25/18* (2006.01)
*C30B 29/06* (2006.01)

(56) References Cited

U.S. PATENT DOCUMENTS

| | | |
|---|---|---|
| 2009/0252942 A1 | 10/2009 | Kanaya et al. |
| 2010/0216261 A1 | 8/2010 | Brenninger et al. |
| 2011/0300323 A1 | 12/2011 | Straubinger et al. |
| 2014/0255247 A1 | 9/2014 | Kralik et al. |
| 2014/0262026 A1* | 9/2014 | Forster ............... B05C 21/005 118/504 |
| 2015/0275395 A1 | 10/2015 | Kang |
| 2017/0117228 A1 | 4/2017 | Schauer et al. |
| 2018/0053629 A1* | 2/2018 | Zhang ............... H01J 37/3244 |
| 2021/0087705 A1 | 3/2021 | Schauer et al. |

FOREIGN PATENT DOCUMENTS

| | | |
|---|---|---|
| EP | 0870852 A1 | 10/1998 |
| JP | 2002009002 A | 1/2002 |
| JP | 200243230 A | 2/2002 |
| JP | 2002261023 A | 9/2002 |
| JP | 2007294942 A | 11/2007 |
| JP | 2009152548 A | 7/2009 |
| JP | 2010034372 A | 2/2010 |
| JP | 2015201599 A | 11/2015 |
| JP | 2018165395 A | 10/2018 |
| JP | 2019096639 A | 6/2019 |
| JP | 2020053627 A | 4/2020 |
| WO | 2014062002 A1 | 4/2014 |
| WO | 2014103657 A1 | 7/2014 |
| WO | 2017135604 A1 | 8/2017 |
| WO | 2019020387 A1 | 1/2019 |

OTHER PUBLICATIONS

Griesmann, Ulf et al., "Manufacture and Metrology of 300 mm Silicon Wafers with Ultra-Low Thickness Variation," AIP Conference Proceedings, vol. 931, pp. 105-110, XP055938943.

* cited by examiner

METHOD FOR DEPOSITING AN EPITAXIAL LAYER ON A SUBSTRATE WAFER

CROSS REFERENCE TO RELATED APPLICATIONS

This application is the U.S. National Phase of PCT Application No. PCT/EP2021/070393 filed Jul. 21, 2021, which claims priority to European Application No. 20191322.5 filed Aug. 17, 2020, the disclosures of which are incorporated in their entirety by reference herein.

BACKGROUND OF THE INVENTION

1. Field of the Invention

The invention relates to a method for depositing an epitaxial layer on a substrate wafer.

2. Description of Related Art

For demanding applications in the electronics industry, epitaxially coated semiconductor wafers are required, in particular substrate wafers made of single-crystal silicon which are epitaxially coated with a layer of silicon.

A commonly used method for depositing the layer is chemical vapor phase deposition. The material for the layer is provided by process gas, which is passed over the side of the substrate wafer to be coated at temperatures at which a precursor compound contained in the process gas and containing the material is chemically cleaved. The substrate wafer is located in the pocket of a susceptor during the deposition of the layer, while at the same time being surrounded by an annular boundary of the susceptor. The process is usually carried out in a device which is designed as a single wafer reactor. For example, such a single-wafer reactor is described in EP0870852 A1.

In order to grow the epitaxial layer as uniform as possible on the substrate wafer, it is particularly important that the substrate wafer is centered in the pocket with respect to the boundary.

In US20100216261 A1 it is proposed to monitor the correct position of the substrate wafer on the receptor by means of a camera system.

WO17135604 A1 proposes to measure a thickness characteristic value in the edge region after the deposited epitaxial layer and to modify certain process parameters for subsequent deposition processes depending on the measurement result.

WO14103657 A1 and JP2015201599 A disclose methods in which an eccentricity is calculated based on the distribution of thickness characteristic values in the edge region of the semiconductor wafer with an epitaxially deposited layer, in order to correct the position of a subsequent substrate wafer on the susceptor as a function of this eccentricity.

US2009252942 A1 and JP2002043230 A propose to measure the flatness of the substrate wafer before the deposition of the epitaxial layer and to modify certain process parameters during the deposition process in such a way that the coating of the substrate wafer reduces an edge roll-off.

However, this procedure does not prevent thickness differences in the edge region of the epitaxially coated substrate wafer if the substrate wafer itself already has thickness differences in the edge region.

The object of the invention is to provide a solution to the problem that allows the thickness of the epitaxial layer to be adjusted according to the edge roll-off of the substrate wafer.

SUMMARY OF THE INVENTION

A method for depositing an epitaxial layer on a substrate wafer is described herein. The method includes measuring an edge geometry of the substrate wafer, placing the substrate wafer at a position in a pocket of a susceptor of a device for depositing the epitaxial layer based on the edge geometry, heating the substrate wafer in the pocket and passing process gas over the substrate wafer while in the pocket. The substrate wafer may have a thicker edge section and a thinner edge section opposite the thicker edge section. The pocket may be surrounded by a boundary to define a reaction chamber.

BRIEF DESCRIPTION OF THE PREFERRED EMBODIMENTS

Figure 1:
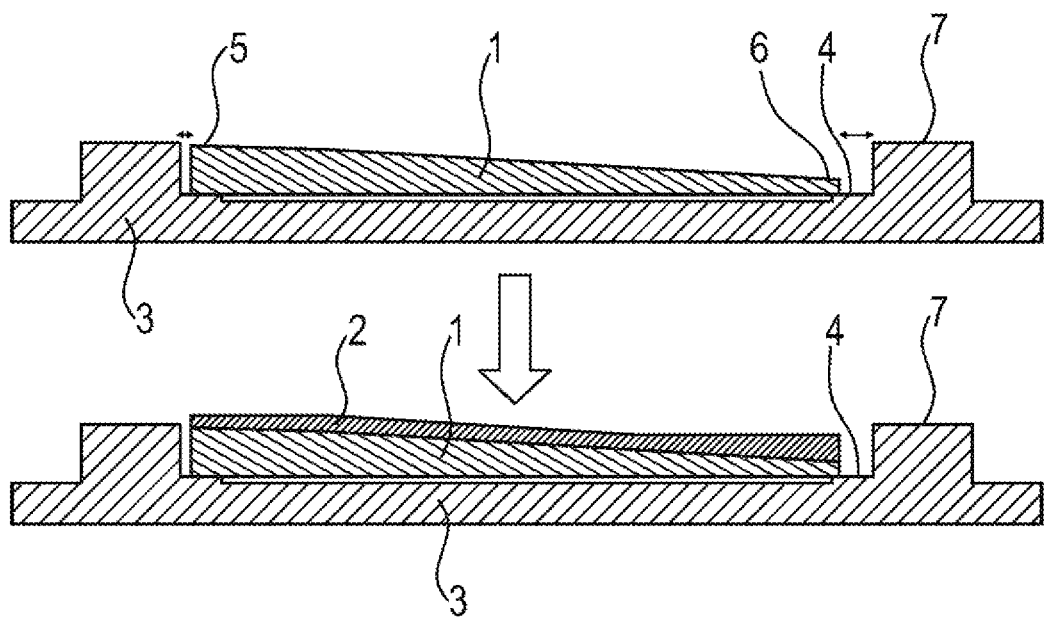
FIG. 1 is a side view of a substrate wafer before (upper) and after (lower) applying a semiconductor material as described herein.

The object of the invention is achieved by a method for depositing an epitaxial layer on a substrate wafer from a vapor phase, comprising
  measuring an edge geometry of the substrate wafer that assigns a thickness characteristic value to an edge of the substrate wafer as a function of edge positions;
  placing the substrate wafer in a pocket of a susceptor of a device for depositing the epitaxial layer, the pocket being surrounded by a boundary with a circular circumference;
  heating the substrate wafer; and
  passing process gas over the substrate wafer;
  which comprises
  placing the substrate wafer in the pocket such that the distance from the substrate wafer to the boundary of the pocket is smaller at edge positions with the thickness characteristic value of a thicker edge than at edge positions with the thickness characteristic value of a thinner edge.

The invention is based on the finding that the centered placement of the substrate wafer in the pocket is based on the assumption that the substrate wafer has a uniform edge geometry. In practice, however, this is rarely the case, because machining steps such as grinding and polishing are not able to create a substrate wafer with a completely uniform edge thickness. The method according to the invention is able to deliver a more uniform edge geometry of an epitaxially coated semiconductor wafer compared to the uncoated substrate wafer, in particular if the substrate wafer has a comparatively low edge thickness in one edge section and a comparatively high edge thickness in the opposite edge section. Nevertheless, a homogenization of the edge thickness can also be achieved if, for example, only one edge section with comparatively low edge thickness is present.

Firstly, the edge geometry of the substrate wafer is measured such that it is available in the form of a thickness characteristic value. Preferably, an outermost edge portion with a radial length of 1 mm or 2 mm is excluded from the measurement as an edge exclusion. In principle, any measured value that allows a statement to be made about the relative thickness at two different sections in the edge region of the substrate wafer can be considered as a thickness parameter. For example, suitable parameters for the thickness characteristic value are the ZDD (Z double derivative) of the front face, which describes the curvature of the edge roll-off and is defined in the SEMI standard M68-0720, or the ESFQR, which quantifies the flatness of sectors (sites) in the edge region and is defined in the SEMI standard M67-0720. The remainder of the description uses ESFQR to represent the thickness characteristic.

The method according to the invention provides for measuring the edge geometry of a substrate wafer before it is coated with an epitaxial layer. For example, a map is provided that assigns an ESFQR value to each sector, thus indicating a thickness profile of the substrate wafer along its circumference. Substrate wafers with a wedge-like cross-sectional shape, or those that are thinner on one edge than on others, are particularly suitable. An edge section means an edge region that extends over a distance of up to 50% of the circumference, preferably 7% to 42% of the circumference in the circumferential direction. A substrate wafer with a wedge-like shape has a thicker edge section and a thinner edge section which are opposite each other, i.e. have the maximum possible distance from each other.

A correlation function is created for the deposition chamber used for coating the substrate wafer, a single-wafer reactor. This function assigns a thickness characteristic value to a displacement vector. The displacement vector indicates the direction and magnitude by which the thicker edge section of the substrate wafer must be offset from the centered position to be placed in the pocket of the susceptor, so that more material is deposited on the opposite, thinner edge section than on the thicker edge section when depositing the epitaxial layer. Accordingly, after the deposition in the thinner edge section of the substrate wafer, the thickness characteristic value is greater by the assigned thickness characteristic value than it would be after the deposition of an epitaxial layer during which the substrate wafer is centered in the pocket of the susceptor. The displacement vector thus represents an eccentricity of the position of the center point of the substrate wafer placed on the susceptor compared to the position that the center point would have if the substrate wafer were centered in the pocket of the susceptor. The correlation function is determined by experiments prior to coating the substrate wafer, by determining which eccentricity results in which change of the thickness characteristic value.

The placement of the substrate wafer in the pocket of the susceptor is preferably carried out by a robot which performs this task as specified by the correlation function.

Alternatively or in addition, the robot can be configured as a self-learning system which uses the measured geometry data of the substrate wafers and the resulting epitaxially coated semiconductor wafers to determine and implement the necessary eccentricity for the coating of subsequent substrate wafers. In addition, it is preferable to monitor the placement of the substrate wafer on the susceptor and its position in the pocket of the susceptor by means of a camera system.

The substrate wafer and the epitaxial layer deposited on it preferably consist essentially of semiconductor material, for example single-crystal silicon. The substrate wafer preferably has a diameter of at least 200 mm, particularly preferably at least 300 mm. The epitaxial layer preferably has a thickness of 1 µm to 20 µm.

The invention is described in further detail below with reference to drawings.

LIST OF REFERENCE SIGNS USED 1 substrate wafer
2 epitaxial layer
3 susceptor
4 pocket
5 thick edge section of the substrate wafer
6 thin edge section of the substrate wafer
7 outer boundary of the pocket
8 map
E eccentricity
ESFQR ESFQR value
ΔESFQR difference between the ESFQR value and the target value
Δt difference of thickness t from target thickness
d diameter
WP edge position FIG. 1 shows a sectional view (vertical section) of a substrate wafer 1, which is deposited in the pocket 4 of a susceptor 3 and has an edge section 5 that is comparatively thick and an edge section 6 opposite thereto that is comparatively thin. The substrate wafer 1 is not located centrally in the pocket 4, but eccentrically, so that the thicker edge section 5 is a shorter distance from a boundary 7 of the pocket than the thinner edge section 6. The consequence of this configuration is that where the distance is smaller, the rate of growth of material during the deposition of the epitaxial layer is lower than where the distance is greater.

The lower part of FIG. 1 shows the situation after the deposition of the epitaxial layer 2. The substrate wafer 1 has become a substrate wafer with a deposited epitaxial layer, wherein the epitaxial layer 2 is thinner in the region of the edge section with a shorter distance to the boundary 4 than in the region of the edge section with a greater distance to the boundary 4. Considering the thickness of the substrate wafer with a deposited epitaxial layer 2 and comparing it with the thickness of the substrate wafer 1, it is found that the thickness of the epitaxially coated substrate wafer in its edge region is more uniform than the thickness of the substrate wafer 1. The thickness differences in the edge region are more pronounced in the case of the substrate wafer 1 than in the case of the epitaxially coated substrate wafer.

Figure 2:
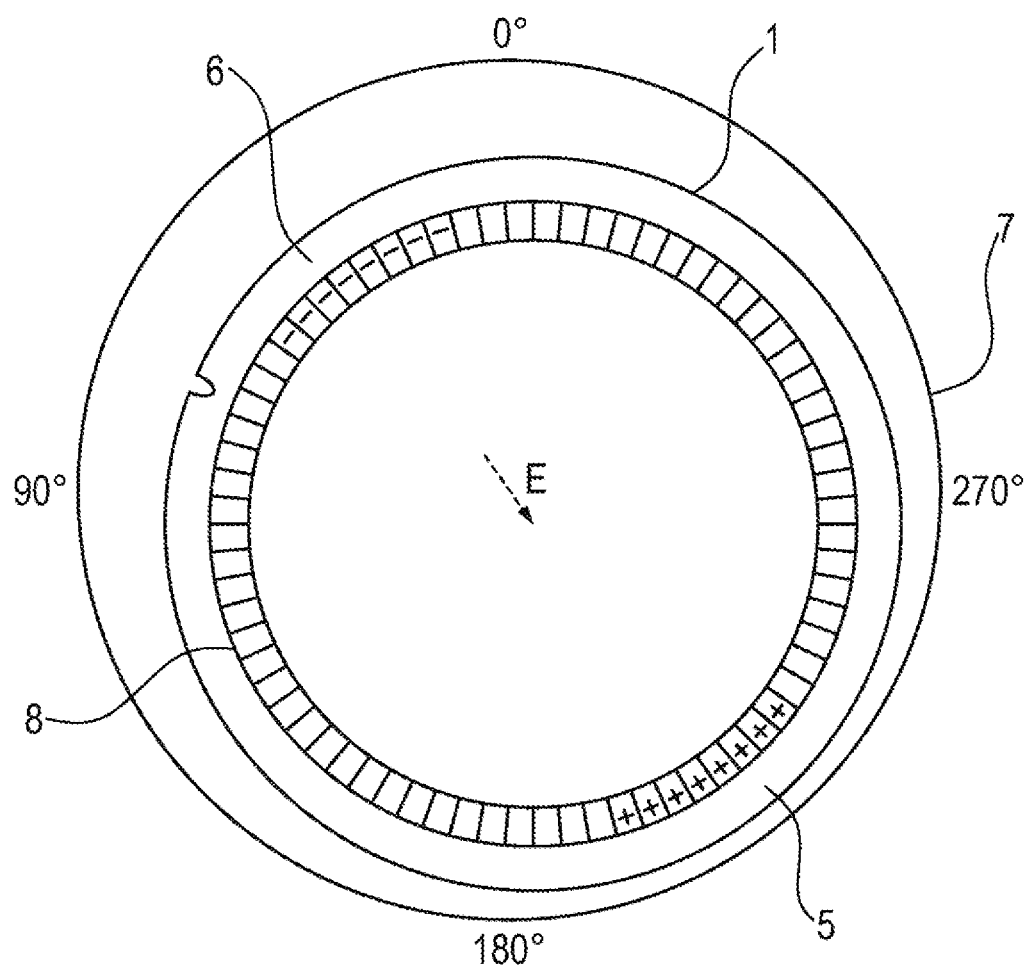
FIG. 2 shows a substrate wafer placed according to the invention in the pocket of the susceptor.

FIG. 2 shows a plan view of a substrate wafer placed according to the invention in the pocket of the susceptor. The substrate wafer 1 is not located centrally in the pocket of the susceptor. The center of the substrate wafer is shifted from the center of the pocket in accordance with the eccentricity E, such that the thicker edge section 6 is a shorter distance from the outer boundary 7 of the pocket than the thinner edge section 6. The direction and magnitude of the eccentricity E depend on a measurement of the edge geometry of the substrate wafer, for example, by measuring the flatness in the form of the ESFQR value in 5°-wide edge segments. The result of the measurement is indicated qualitatively by the depicted map 8 and identifies the thicker edge section 5 highlighted with "+" symbols and the thinner edge section 6 highlighted with "−" symbols.

Figure 3:
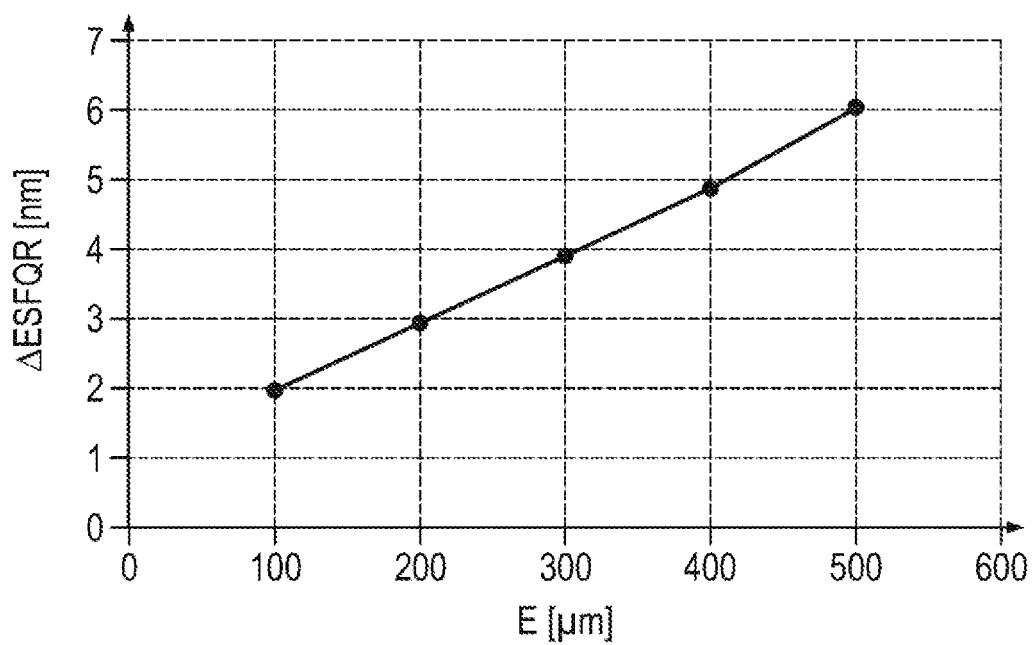
FIG. 3 shows a chart depicting a correlation function that assigns an expected change in a thickness characteristic value based on an eccentricity E.

The selected eccentricity E is based on a correlation function which is determined by preliminary tests for the deposition device to be used. The tests examine what change in the thickness characteristic value is to be expected when the substrate wafer is placed in the pocket of the susceptor with a certain eccentricity E. In the selected example, the correlation function according to FIG. 3 indicates the difference ΔESFQR in the ESFQR value obtained in the thinner edge section after the deposition when the substrate wafer is not placed in the pocket of the susceptor in a central position, but with the corresponding eccentricity E. The correlation function according to FIG. 3 thus suggests that after the deposition of the epitaxial layer, the ESFQR value in the sectors of the thinner edge section will be increased by approximately 2 nm if the substrate wafer was not placed in the pocket of the susceptor centrally, but rather with an eccentricity of 100 μm before the deposition.

Figure 4:
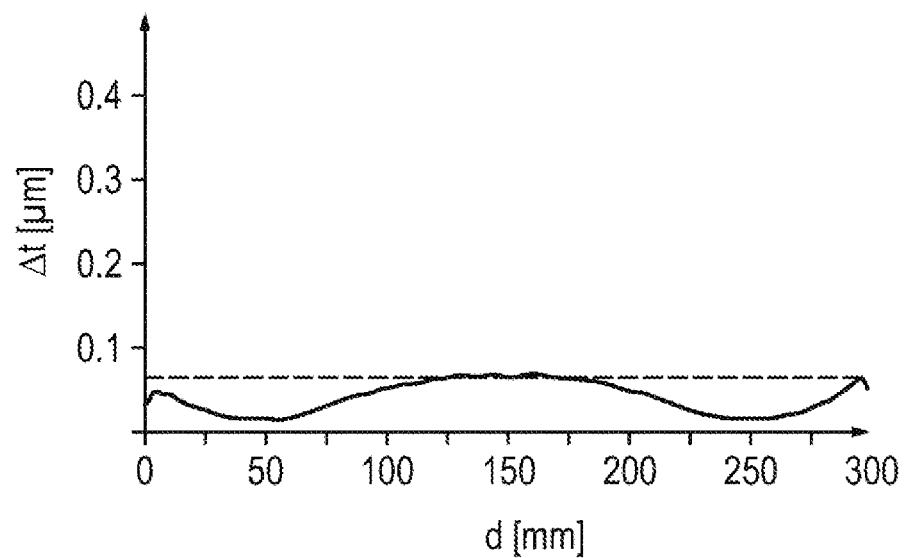
FIG. 4 shows the deviation of the thickness of a substrate wafer from a target thickness along its diameter
Figure 5:
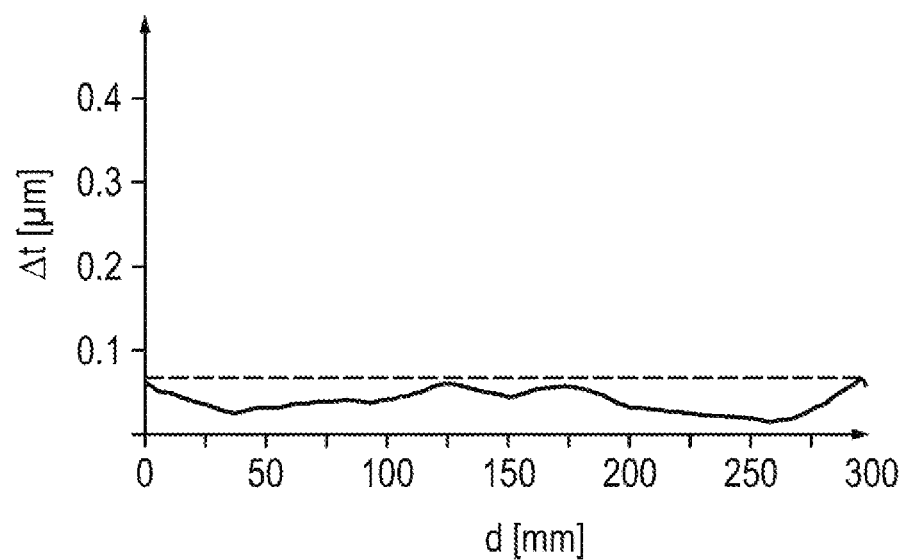
FIG. 5 shows the deviation of the thickness of the epitaxially coated substrate wafer according to FIG. 4 from a target thickness along the diameter of the epitaxially coated substrate wafer
Figure 6:
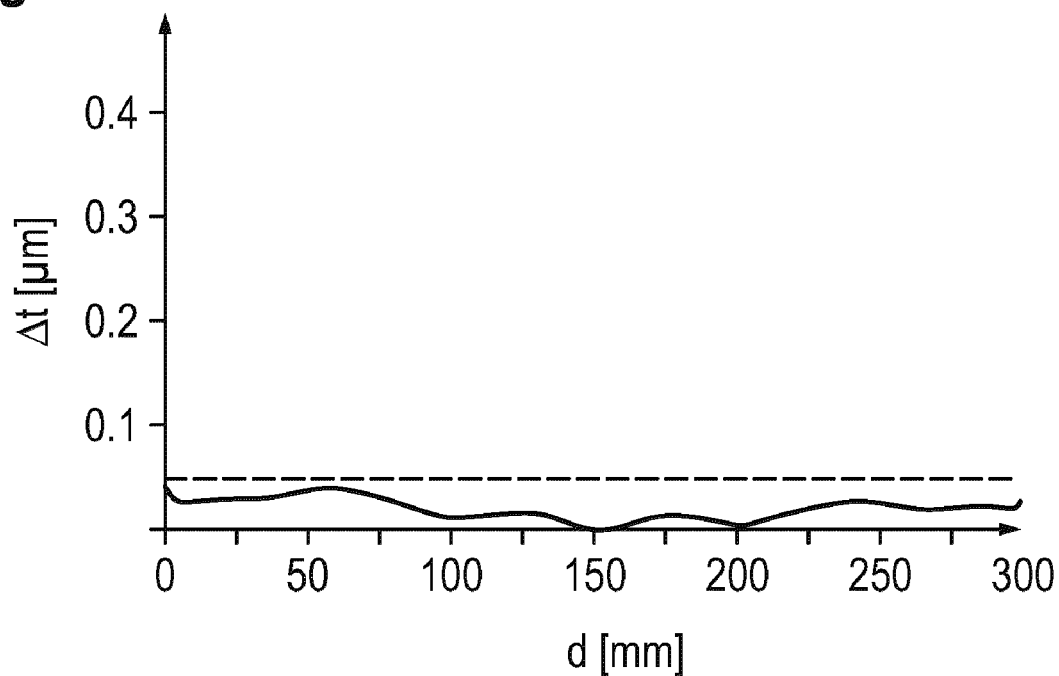
FIG. 6 shows the deviation of the thickness of the epitaxial layer of the coated substrate wafer according to FIG. 5 from a target thickness along the diameter of the epitaxial layer.

FIG. 4, FIG. 5 and FIG. 6 respectively show the curve of the deviation of a thickness from a target thickness of a single-crystal silicon substrate wafer before (FIG. 4) and after (FIG. 5) the deposition of an epitaxial layer, and the deviation of the thickness of the epitaxial layer (FIG. 6) from a target thickness. According to FIG. 4, the substrate wafer had significantly different edge thicknesses, with a thinner edge section in the region of 0 mm and a thicker edge section in the region of 300 mm. After the deposition of the epitaxial layer according to the present invention, the difference in the edge thicknesses in these edge sections was almost compensated (FIG. 5). The curve of the thickness deviation of the epitaxial layer according to FIG. 6 shows that due to the application of the invention, the epitaxial layer is thicker at the edge position corresponding to the thinner edge section of the substrate wafer and is thinner at the edge position corresponding to the thicker edge section of the substrate wafer. The eccentric position of the substrate wafer has caused different amounts of material to be deposited at the edge sections under consideration.

Figure 7:
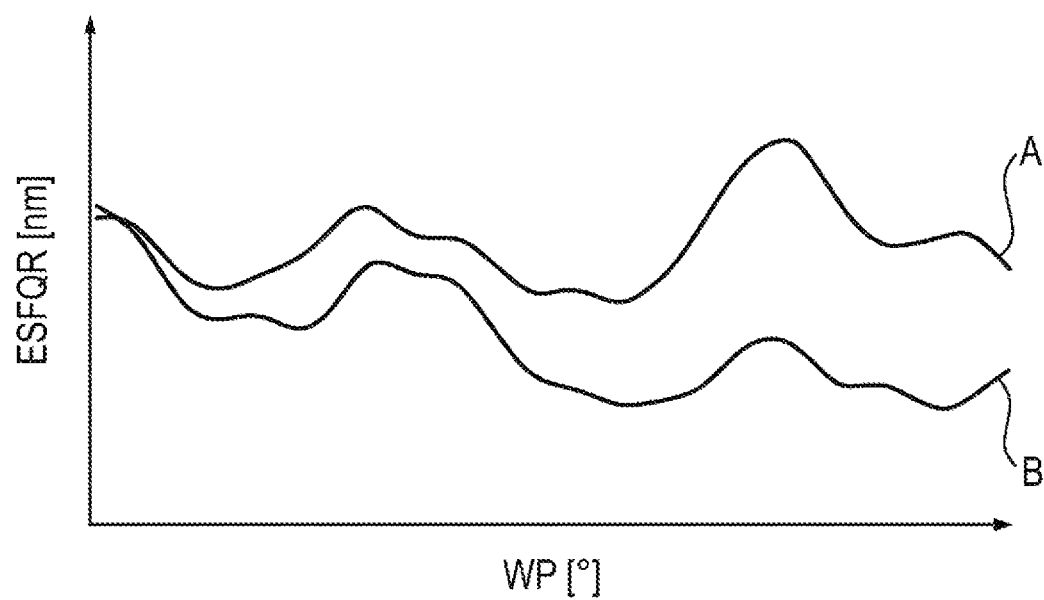
FIG. 7 shows the curve of the deviation of the thickness characteristic value from a target value along the circumference of a substrate wafer before and after the deposition of an epitaxial layer.

The approach according to the invention improves the edge geometry, even if it is considered over the entire circumference. FIG. 7 shows the edge geometry of a substrate wafer in the form of smoothed curves before (curve A) and after (curve B) the deposition of an epitaxial layer, in this case in the form of the ESFQR value as a function of the edge position WP. The curves are based on 72 measurement points, each of which describes the ESFQR value of a sector with a width of 5° and a radial length of 35 mm, allowing for an edge exclusion of 1 mm.

The above description of example embodiments is to be understood as exemplary. The resulting disclosure enables, on the one hand, the person skilled in the art to understand the present invention and its associated advantages, and on the other hand, also encompasses obvious variations and modifications of the described structures and methods within the understanding of the person skilled in the art. Therefore, all such variations and modifications as well as their equivalents are intended to be covered by the scope of protection of the claims.

The invention claimed is:

1. A method for depositing an epitaxial layer on a substrate wafer comprising:

measuring an edge geometry of the substrate wafer, the substrate wafer having a thicker edge section and a thinner edge section opposite the thicker edge section;

placing the substrate wafer at a position in a pocket of a susceptor of a device for depositing the epitaxial layer, the pocket being surrounded by a boundary and the position being based on the edge geometry, wherein the position in the pocket is such that a first distance from the thicker edge section to the boundary of the pocket is less than a second distance from the thinner edge section to the boundary of the pocket;

beating the substrate wafer in the pocket, and passing process gas over the substrate wafer while in the pocket such that an epitaxial layer thickness is greater on the thinner edge section than on the thicker edge section.

2. The method of claim 1, further comprising assigning thickness characteristic values to edge portions of the substrate wafer based on the edge geometry wherein the position is determined by a function of an expected change in the thickness characteristic value to an eccentricity.

3. The method of claim 1, wherein the boundary has a circular circumference.

4. The method of claim 1, wherein a robot places the rate wafer in the pocket.

5. The method of claim 1, further comprising a camera system to position the substrate wafer in the pocket.

6. The method of claim 1, wherein a single-crystal silicon epitaxial layer is deposited on the substrate wafer.

7. The method of claim 1, wherein the epitaxial layer is deposited from a vapor phase.

8. A method depositing an epitaxial layer on a substrate v aft comprising:

machining a substrate wafer such that it does not have a uniform edge thickness measuring an edge geometry of the substrate wafer, the substrate wafer having a thicker edge section and a thinner edge section opposite the thicker edge section;

placing the substrate wafer at a pocket of a susceptor of a device for depositing the epitaxial layer, the pocket being surrounded by a boundary and the position being based on the edge geometry;

heating the substrate wafer in the pocket; and passing process r the substrate wafer while in the pocket such that an epitaxial layer thickness is greater on the thinner edge section than on the thicker edge section.

9. The method of claim 1, wherein measuring includes defining a map that assigns an ESFOR value to each sector corresponding to a thickness profile of the substrate wafer along its circumference.

10. The method of claim 1, wherein a thinner epitaxial layer is applied to the thicker edge section and a thicker epitaxial layer is applied to the thinner edge section.

11. The method of claim 1, wherein epitaxial layer has a thickness of 1 to 20 μm.

12. The method of claim 1, wherein the substrate wafer has a diameter of at least 200 mm.

13. The method of claim 1, wherein a self-learning system is employed to position the substrate wafer.

14. A method for depositing an epitaxial layer on a substrate wafer comprising:

measuring an edge geometry of the substrate wafer, the substrate wafer having a thicker edge section and a thinner edge section opposite the thicker edge section;

assigning thickness characteristic values to edge portions of the substrate wafer based on the edge geometry placing the substrate wafer at a position in a pocket of a susceptor of a device for depositing the epitaxial layer, the pocket being surrounded by a boundary and the position being based on the edge geometry, wherein the position is determined by a function of an expected change in the thickness characteristic value to an eccentricity;

heating the substrate wafer in the pocket; and passing process gas over the substrate wafer while in the pocket such that an epitaxial layer thickness is greater on the thinner edge section than on the thicker edge section.

15. The method of claim 14, wherein the function is determined by prior testing of the device.

16. The method of claim 14, wherein the thicker edge section has a greater thickness characteristic value than the thinner edge section.

17. The method of claim 16, wherein a distance between the boundary of the susceptor and each edge portion of the substrate wafer corresponds to the thickness characteristic values of the edge portion.

18. The method of claim 14, wherein the thickness characteristic values include a ESFOR or a ZDD.

19. The method of claim 14, wherein each edge portion is up to 50% of a circumference of the substrate wafer.

20. The method of claim 14, within each edge portion is 7 to 42% of a circumference of the substrate wafer.

* * * * *